United States Patent
Osanai

(10) Patent No.: US 9,559,668 B2
(45) Date of Patent: Jan. 31, 2017

(54) DRIVE CIRCUIT AND SEMICONDUCTOR APPARATUS

(71) Applicant: TOYOTA JIDOSHA KABUSHIKI KAISHA, Toyota-shi, Aichi-ken (JP)

(72) Inventor: Yosuke Osanai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/684,764

(22) Filed: Apr. 13, 2015

(65) Prior Publication Data
US 2015/0358000 A1    Dec. 10, 2015

(30) Foreign Application Priority Data

Jun. 6, 2014 (JP) ................. 2014-117325

(51) Int. Cl.
*H03K 3/015* (2006.01)
*H03K 17/60* (2006.01)

(52) U.S. Cl.
CPC .............. *H03K 3/015* (2013.01); *H03K 17/60* (2013.01)

(58) Field of Classification Search
USPC .......... 327/109–112, 538–541; 323/311–315
See application file for complete search history.

(56) References Cited

U.S. PATENT DOCUMENTS

| | | | |
|---|---|---|---|
| 6,407,620 B1 | 6/2002 | Hirayama | |
| 6,864,741 B2* | 3/2005 | Marsh | G05F 3/30 323/315 |
| 7,382,180 B2* | 6/2008 | Chen | G05F 3/262 323/316 |
| 8,410,821 B2* | 4/2013 | Ohara | G05F 1/573 327/543 |
| 8,829,883 B2* | 9/2014 | Samid | G05F 1/56 323/313 |
| 2007/0030055 A1 | 2/2007 | Hasegawa | |
| 2010/0213989 A1 | 8/2010 | Nakatake et al. | |
| 2012/0161737 A1 | 6/2012 | Yamauchi | |
| 2012/0194226 A1 | 8/2012 | Itou et al. | |
| 2013/0147525 A1 | 6/2013 | Takagiwa | |

(Continued)

FOREIGN PATENT DOCUMENTS

| | | |
|---|---|---|
| JP | H11-214933 A | 8/1999 |
| JP | 2007-049233 A | 2/2007 |

(Continued)

*Primary Examiner* — An Luu
(74) *Attorney, Agent, or Firm* — Oliff PLC

(57) ABSTRACT

A drive circuit includes a gate drive node, a power source node, and an output transistor connected between the gate drive node and the power source node that flows a current into the gate drive node. The drive circuit further includes an input transistor smaller than the output transistor that forms a current mirror with the output transistor. The drive circuit further includes an operational amplifier that outputs a control voltage depending on a potential difference between a voltage of the gate drive node and a constant voltage lower than a voltage of the power source node. The drive circuit further includes a control transistor including a control electrode receiving an output of the operational amplifier that is connected in series with the input transistor. The drive circuit further includes a constant current source connected in series with the control transistor.

12 Claims, 10 Drawing Sheets

(56) References Cited

U.S. PATENT DOCUMENTS

2013/0214823 A1 8/2013 Kawamoto et al.
2013/0285732 A1 10/2013 Mori

FOREIGN PATENT DOCUMENTS

| JP | 2012-134828 A | 7/2012 |
|----|---------------|--------|
| JP | 2012-157223 A | 8/2012 |
| JP | 2013-034382 A | 2/2013 |
| JP | 2013-169102 A | 8/2013 |
| JP | 2013-219633 A | 10/2013 |
| WO | 2009/044602 A1 | 4/2009 |
| WO | 2012/153459 A1 | 11/2012 |

* cited by examiner

DRIVE CIRCUIT AND SEMICONDUCTOR APPARATUS

FIELD

The disclosures herein generally relate to a drive circuit and a semiconductor apparatus.

BACKGROUND

Conventionally, an electronic apparatus has been known that performs an operation to flow a constant current into the gate of an IGBT, to make the voltage of the gate constant (see, for example, Patent Document 1). This electronic apparatus has a driving power source circuit, a constant current source, and a switch, which are connected in series between the gate and the power source.

RELATED-ART DOCUMENTS

Patent Documents

[Patent Document 1] Japanese Laid-open Patent Publication No. 2012-157223

To obtain an operational speed to a certain extent when a transistor such as an IGBT switches, a circuit configuration is required between the gate and the power source so that a large current can be flowed into the gate of the transistor (a circuit configuration having a large current capacity). However, in such an electronic apparatus, components that exist between the gate and the power source (the driving power source circuit, constant current source, and switch) need to be made larger to bear the large current. Consequently, the circuit size between the gate and the power source becomes larger.

Thereupon, it is an object of at least one embodiment of the present invention to provide a drive circuit and a semiconductor apparatus that have a large current capacity between the gate and the power source with a simple configuration, and are capable of performing an operation to flow a constant current into the gate, to make the voltage of the gate constant.

SUMMARY

According to at least one embodiment of the present invention, a drive circuit includes a gate drive node; a power source node; an output transistor configured to be connected between the gate drive node and the power source node, and to flow a current into the gate drive node; an input transistor configured to form a current mirror with the output transistor, and to have a smaller size than the output transistor; an operational amplifier configured to output a control voltage depending on a potential difference between a voltage received as input depending on a voltage of the gate drive node, and a constant voltage lower than a voltage of the power source node; a constant current source configured to generate a constant current; and a control transistor configured to control a current flowing in the input transistor to be less than or equal to the constant current, depending on the control voltage.

According to at least one embodiment of the present invention, the circuit size between the gate and the power source can be made smaller because components between the gate and the power source, through which a large current flows, can be minimized. Therefore, it is possible to have a large current capacity between the gate and the power source with a simple configuration, and to perform an operation to flow a constant current into the gate, to make the voltage of the gate constant.

DESCRIPTION OF EMBODIMENTS

In the following, embodiments of the present invention will be described with reference to the drawings.

Figure 1:
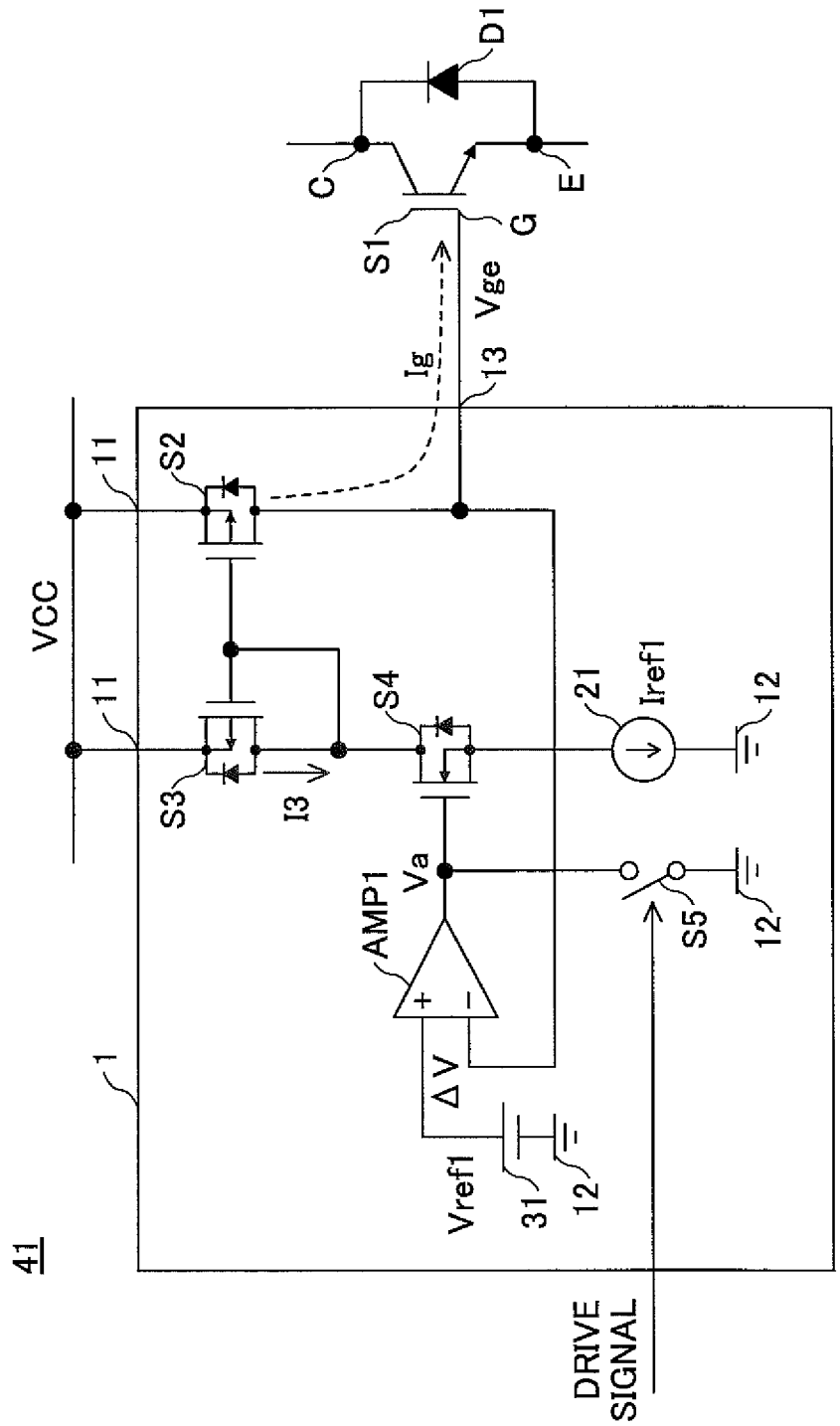
FIG. 1 is a configuration diagram illustrating an example of a drive circuit and a semiconductor apparatus.

FIG. 1 is a configuration diagram illustrating an example of a drive circuit 1 and a semiconductor apparatus 41. The semiconductor apparatus 41 is an example of a semiconductor apparatus that includes the drive circuit 1 and a transistor S1, and is a drive apparatus to drive, for example, the transistor S1 on and off. The drive circuit 1 is an example of a drive circuit that drives the gate G of the transistor S1, and includes a gate drive node 13 connected with the gate G of the transistor S1. The drive circuit 1 includes the gate drive node 13, a power source node 11, an output transistor S2, an input transistor S3, an operational amplifier AMP1, a constant current source 21, and a control transistor S4.

The gate drive node 13 is a node that can be connected with the gate G of the transistor S1. The power source node 11 is a node that can receive a power supply voltage VCC as input.

The output transistor S2 is connected between the gate drive node 13 and the power source node 11, and is a switching element to flow a gate current Ig into the gate drive node 13. The input transistor S3 forms a current mirror with the output transistor S2, and is a switching element having a size smaller than the output transistor S2.

The operational amplifier AMP1 outputs a control voltage Va depending on a potential difference $\Delta V$ between a voltage received as input depending on a voltage of the gate drive node 13, and a constant voltage Vref1 lower than the voltage VCC of the power source node 11. In FIG. 1, the voltage of the gate drive node 13 is the same as the voltage received as input depending on the voltage of the gate drive node 13, and is also equivalent to the gate voltage Vge applied to the gate G of the transistor S1.

The constant current source 21 generates a constant current Iref1. The control transistor S4 is a switching element to control a current I3 flowing in the input transistor S3 to be less than or equal to the constant current Iref1, depending on the control voltage Va.

Figure 2:
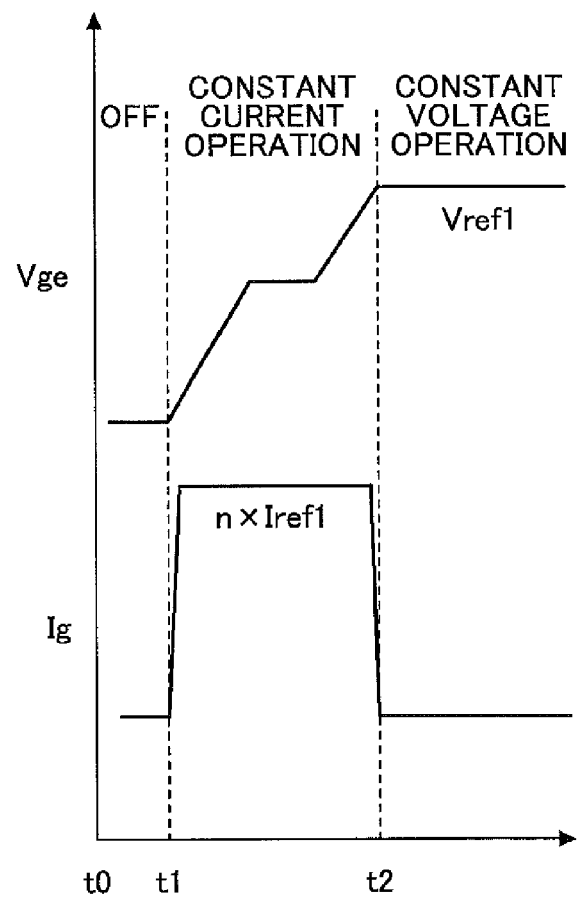
FIG. 2 is a timing chart illustrating an example of an operation of a drive circuit and a semiconductor apparatus.
Figure 3:
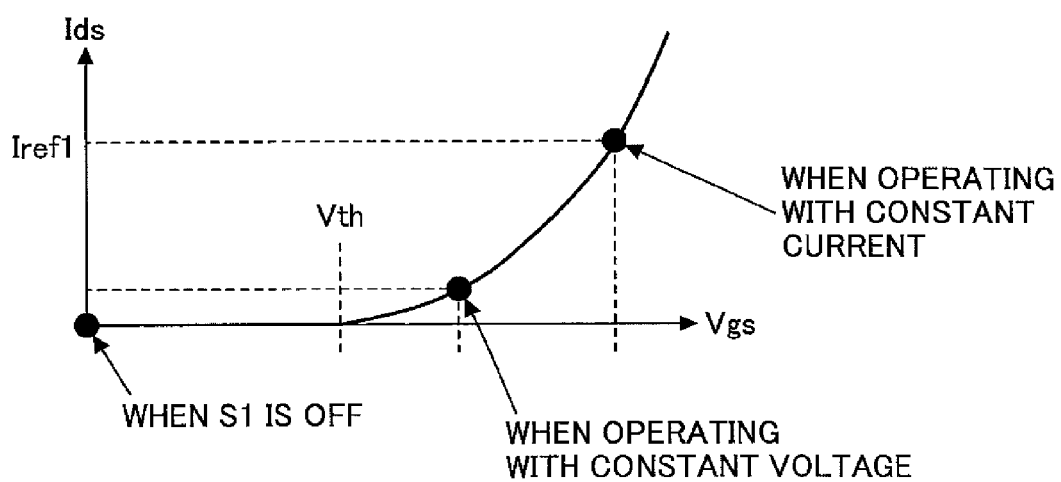
FIG. 3 is a diagram illustrating an example of an operational waveform of a control transistor.

FIG. 2 is a timing chart illustrating an example of an operation of the drive circuit 1 and the semiconductor apparatus 41. FIG. 3 is a diagram illustrating an example of an operational waveform of the control transistor S4, which illustrates a relationship between the voltage Vgs between the gate and source of the control transistor S4, and the current Ids flowing between the drain and source of the control transistor S4. Next, an example of an operation of the drive circuit 1 and the semiconductor apparatus 41 illustrated in FIG. 1 will be described with reference to FIGS. 2-3.

During a turned-on period t1-t2 soon after the transistor S1 has been switched from off to on, the drive circuit 1 performs a constant current operation to flow the constant gate current Ig into the gate drive node 13.

For example, soon after the transistor S1 has been switched from off to on, the gate voltage Vge is a comparatively low voltage, and a voltage input into an inverted input terminal (−) of the operational amplifier AMP1 (voltage equivalent to the gate voltage Vge in FIG. 1) depending on the gate voltage Vge is sufficiently lower than the constant voltage Vref1. Therefore, since the potential difference ΔV between the gate voltage Vge and the constant voltage Vref1 is large, the control voltage Va output from the operational amplifier AMP1 is high. The high control voltage Va makes the voltage Vgs between the gate and source of the control transistor S4 higher than a threshold voltage Vth of the control transistor S4 (see FIG. 3), and hence, the control transistor S4 transitions to an on state.

The current Ids flowing in the control transistor S4 caused by the control transistor S4 being turned on, is determined by the constant current Iref1 generated by the constant current source 21. Namely, the control transistor S4 controls the current Ids depending on the control voltage Va, not to exceed an upper limit of the constant current Iref1. Therefore, during the turned-on period t1-t2, the current Ids having the same current value as the constant current Iref1 flows in the control transistor S4. Also, since the current I3 flowing between the drain and source of the input transistor S3 is equivalent to the current Ids flowing between the drain and source of the control transistor S4, during the turned-on period t1-t2, the same current as that in the control transistor S4 (namely, the constant current Iref1) flows between the drain and source of the input transistor S3.

The input transistor S3 and the output transistor S2 form a current mirror, and the size of the input transistor S3 is smaller than the size of the output transistor S2. The size of a transistor is determined by a ratio of the channel width W of the transistor and the channel length L of the transistor (W/L). Therefore, if the size of the input transistor S3 is equivalent to 1/n (where n is a positive real number) of the size of the output transistor S2, the gate current Ig output from the output transistor S2 takes a constant current value that is n times the constant current Iref1, to be supplied to the gate G of the transistor S1. Namely, the output transistor S2 charges the gate G of the transistor S1 by this constant gate current Ig (=n×Iref1).

When the gate G of the transistor S1 starts being charged by the constant gate current Ig, the gate voltage Vge rises. Since the gate voltage Vge is applied as feedback input to the inverted input terminal (−) of the operational amplifier AMP1, while the gate voltage Vge is rising, the voltage applied as input to the inverted input terminal (−) approaches the constant voltage Vref1.

When the voltage applied as input to the inverted input terminal (−) has risen to be virtually the same as the constant voltage Vref1 (has risen so that the potential difference ΔV becomes virtually zero), the control voltage Va starts reducing from the voltage value taken in the constant current operation. Since the reduction of the control voltage Va also reduces the voltage Vgs between the gate and source of the control transistor S4, the current Ids flowing in the control transistor S4 in the on state reduces lower than the constant current Iref1 (see FIG. 3). When the current Ids reduces, the current I3 and the gate current Ig also reduce. Namely, the output transistor S2 supplies the gate current Ig to the gate G of the transistor S1, with which the voltage input into the inverted input terminal (−) of the operational amplifier AMP1 does not exceed the constant voltage Vref1 (the gate voltage Vge in FIG. 1).

When the gate voltage Vge is going to reduce due to the reduction of the gate current Ig, the operational amplifier AMP1 adjusts the control voltage Va so that the constant voltage Vref1 is equivalent to the voltage input into the inverted input terminal (−). Namely, after the time t2 in FIG. 2 when the gate current Ig starts reducing, the operational amplifier AMP1 operates so that the gate voltage Vge is equivalent to the constant voltage Vref1.

In this way, according to the drive circuit 1 or the semiconductor apparatus 41, the circuit configuration between the power source node 11 and the gate drive node 13 only includes the output transistor S2 that flows the gate current Ig n times greater than the constant current Iref1. Also, it is possible to make the gate voltage Vge equivalent to the constant voltage Vref1 after having the constant gate current Ig (=n×Iref1) flow into the gate G of the transistor S1. Namely, according to the drive circuit 1 or the semiconductor apparatus 41, a simple configuration having a large current capacity between the power source outputting the power supply voltage VCC, and the gate G of the transistor S1 can make the voltage of the gate G constant after completing an operation to flow a constant current into the gate G.

By making the voltage of the gate G constant after completing an operation to flow a constant current into the gate G, for example, even if the transistor S1 having been turned on is forcibly turned off, it is possible to suppress both a rise of a surge voltage generated at the transistor S1, and an increased loss.

Next, the configuration in FIG. 1 will be described in detail.

The semiconductor apparatus 41 is a semiconductor circuit that includes a unit to drive an inductive load (for example, an inductor or a motor) connected with the collector C or emitter E of the transistor S1, for example, by driving the transistor S1 on and off.

An apparatus that uses one or more semiconductor apparatuses 41 may include, for example, a power conversion apparatus to convert power between input and output, by driving the transistor S1 on and off. Specific examples of such a power conversion apparatus may include a converter to boost or to step down a DC power, an inverter for power conversion between a DC power and an AC power, and the like.

The transistor S1 is, for example, an IGBT (Insulated Gate Bipolar Transistor) having a gate G, a collector C, and an emitter E. The gate G is a control terminal connected with the gate drive node 13 of the drive circuit 1. The collector C is a first main terminal connected with the cathode of a diode D1. The emitter E is a second main terminal connected with the anode of the diode D1.

The drive circuit 1 is, for example, an IC (integrated circuit) chip. The drive circuit 1 and the transistor S1 may be formed on the same substrate or on different substrates.

The drive circuit 1 turns the transistor S1 on or off, following a drive signal. The drive signal is a command signal to turn on or off the transistor S1, which is a signal (for example, a pulse width modulation signal) supplied from an external apparatus such as a microcomputer at an upper level of the drive circuit 1 or the semiconductor apparatus 41.

The drive circuit 1 may include a switch S5 to turn off the output transistor S2. The switch S5 is a switching element to turn off the control transistor S4, by making the voltage of the control electrode of the control transistor S4 less than or equal to the threshold voltage Vth of the control transistor S4. By making the control transistor S4 turn off, the current Ids does not flow in the control transistor S4, which also makes the input transistor S3 and the output transistor S2 turn off. By having the output transistor S2 turned off, the gate current Ig and the power supply voltage VCC are not output to the gate G of the transistor S1, and hence, the transistor S1 can be turned off (see an off-period t0-t1 in FIG. 2, and FIG. 3).

The switch S5 is a transistor that is turned off, for example, when the drive signal commanding to turn on the transistor S1 is input, and is turned on when the drive signal commanding to turn off the transistor S1 is input. By having the switch S5 turned on and off in this way, the switch S5, the input transistor S3, the output transistor S2, and the transistor S1 can be synchronized to be turned on and off by a common drive signal.

The switch S5 is placed, for example, between the control electrode of the control transistor S4 and the ground node 12, and turns off the control transistor S4, by connecting the control electrode of the control transistor S4 with the ground node 12.

Note that the drive circuit 1 may include a gate-off circuit that makes the gate voltage Vge of the transistor S1 less than or equal to the threshold voltage of the transistor S1 following the drive signal commanding to turn off the transistor S1.

The gate drive node 13 is a gate drive terminal connected with, for example, the gate G of the transistor S1. The power source node 11 is a power terminal connected with, for example, the power source that outputs the power supply voltage VCC. The ground node 12 is a ground terminal connected with, for example, the ground potential.

The output transistor S2 is, for example, a P-channel MOSFET (Metal Oxide Semiconductor Field Effect Transistor). The output transistor S2 includes, for example, a gate connected with the gate of the input transistor S3, a drain connected with the gate drive node 13 and the inverted input terminal (−) of the operational amplifier AMP1, and a source connected with the power source node 11.

The input transistor S3 is, for example, a P-channel MOSFET having the same structure as the output transistor S2, and has a characteristic (output characteristic with respect to the gate input) similar to that of the output transistor S2. The input transistor S3 includes, for example, a gate connected with the drain of the input transistor S3, a drain connected with the drain of the control transistor S4, and a source connected with the power source node 11.

The control transistor S4 is, for example, an N-channel MOSFET connected in series with the input transistor S3, and includes a gate (control electrode) receiving the control voltage Va as input, a drain connected with the drain and the gate of the input transistor S3, and a source connected with an upstream node of the constant current source 21.

The constant current source 21 is connected in series with the control transistor S4, and connected in series with the input transistor S3 via the control transistor S4. The constant current source 21 is placed between the control transistor S4 and the ground node 12, and includes an upstream node connected with the source of the control transistor S4 and a downstream node connected with the ground node 12.

The operational amplifier AMP1 is a differential amplifier to output the control voltage Va depending on a differential input voltage which is a potential difference between the inverted input terminal (−) and the non-inverted input terminal (+), to the control electrode of the control transistor S4. The operational amplifier AMP1 includes the inverted input terminal (−) connected with the gate drive node 13, and the non-inverted input terminal (+) connected with the constant voltage source 31. The constant voltage source 31 generates the constant voltage Vref1.

Figure 4:
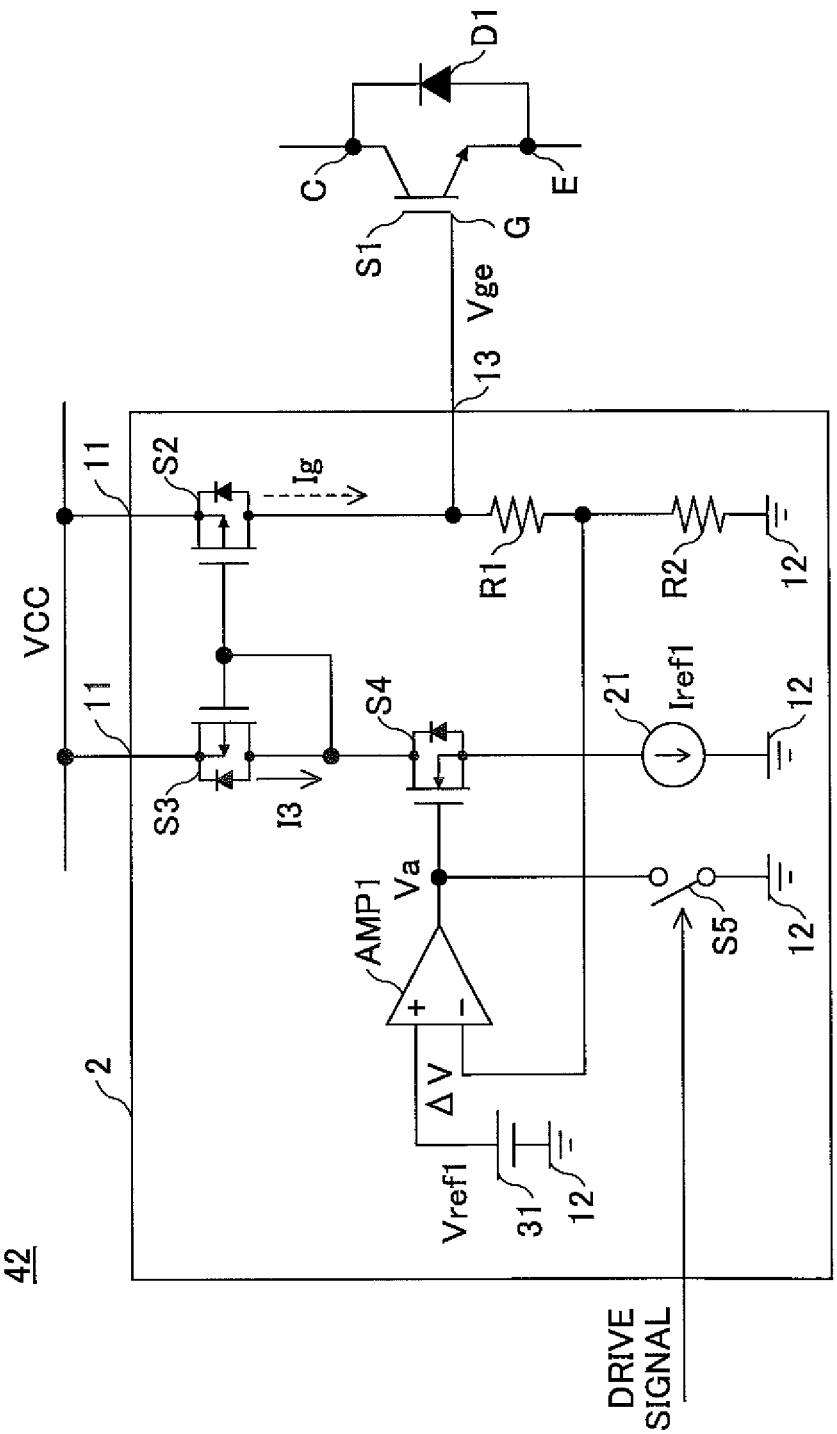
FIG. 4 is a configuration diagram illustrating an example of a drive circuit and a semiconductor apparatus.

FIG. 4 is a configuration diagram illustrating an example of a drive circuit 2 and a semiconductor apparatus 42. Description is omitted for substantially the same configuration and effects as in the previous embodiment. The gate voltage Vge and the constant voltage Vref1 take the same voltage value during a constant voltage operation in FIG. 1, but they may not take the same voltage value in the present embodiment. In FIG. 4, a voltage obtained by dividing the voltage of the gate drive node 13 (gate voltage Vge in the figure) by resistors is input into the operational amplifier AMP1.

For example, the drive circuit 2 has multiple resistors connected in series that are inserted between the gate drive node 13 and the ground node 12. A connection point between a resistor R1 and a resistor R2 is connected with the inverted input terminal (−) of the operational amplifier AMP1.

Figure 5:
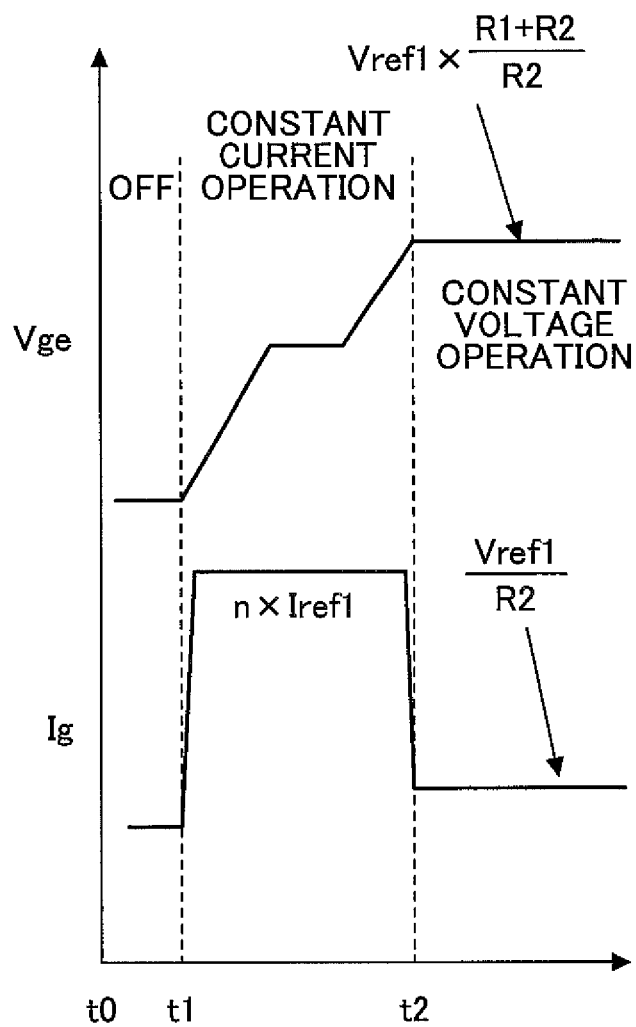
FIG. 5 is a timing chart illustrating an example of an operation of a drive circuit and a semiconductor apparatus.

FIG. 5 is a timing chart illustrating an example of an operation of the drive circuit 2 and the semiconductor apparatus 42. It is the same as in FIG. 1 that the switch S5 is turned on during an off period t0-t1 of the transistor S1 to turn off the output transistor S2. It is also the same as in FIG. 1 that during a turned-on period t1-t2 soon after the transistor S1 has been switched from off to on, the drive circuit 2 performs an operation to flow the constant gate current Ig (=n×Iref1).

After the time t2 when an on state of the transistor S1 becomes stable, the output transistor S2 supplies the gate current Ig to the gate G of the transistor S1, with which the voltage input into the inverted input terminal (−) of the operational amplifier AMP1 does not exceed a constant voltage (Vge×R2/(R1+R2) in FIG. 4). At this moment, the current value of the gate current Ig is constant (Ig=Vref1/R2).

When the gate voltage Vge is going to be reduced due to the reduction of the gate current Ig, the operational amplifier AMP1 adjusts the control voltage Va so that the constant voltage Vref1 is equivalent to the voltage input into the inverted input terminal (−). Namely, after the time t2 in FIG. 2 when the gate current Ig starts reducing, the operational amplifier AMP1 operates so that the gate voltage Vge is equivalent to the constant voltage (Vref1×(R1+R2)/R2). Note that the gate voltage Vge during the constant voltage operation is "Vge=Vref1×(R1+R2)/R2<VCC".

As described above, the drive circuit 2 or the semiconductor apparatus 42 has a configuration in which a voltage obtained by dividing the voltage of the gate drive node 13 by the resistors is input into the operational amplifier AMP1. Thus, by adjusting the resistance of the resistor R1 or resistor R2, the gate voltage Vge during a constant voltage operation can be adjusted to an arbitrary voltage value that is different from the constant voltage Vref1.

Figure 6:
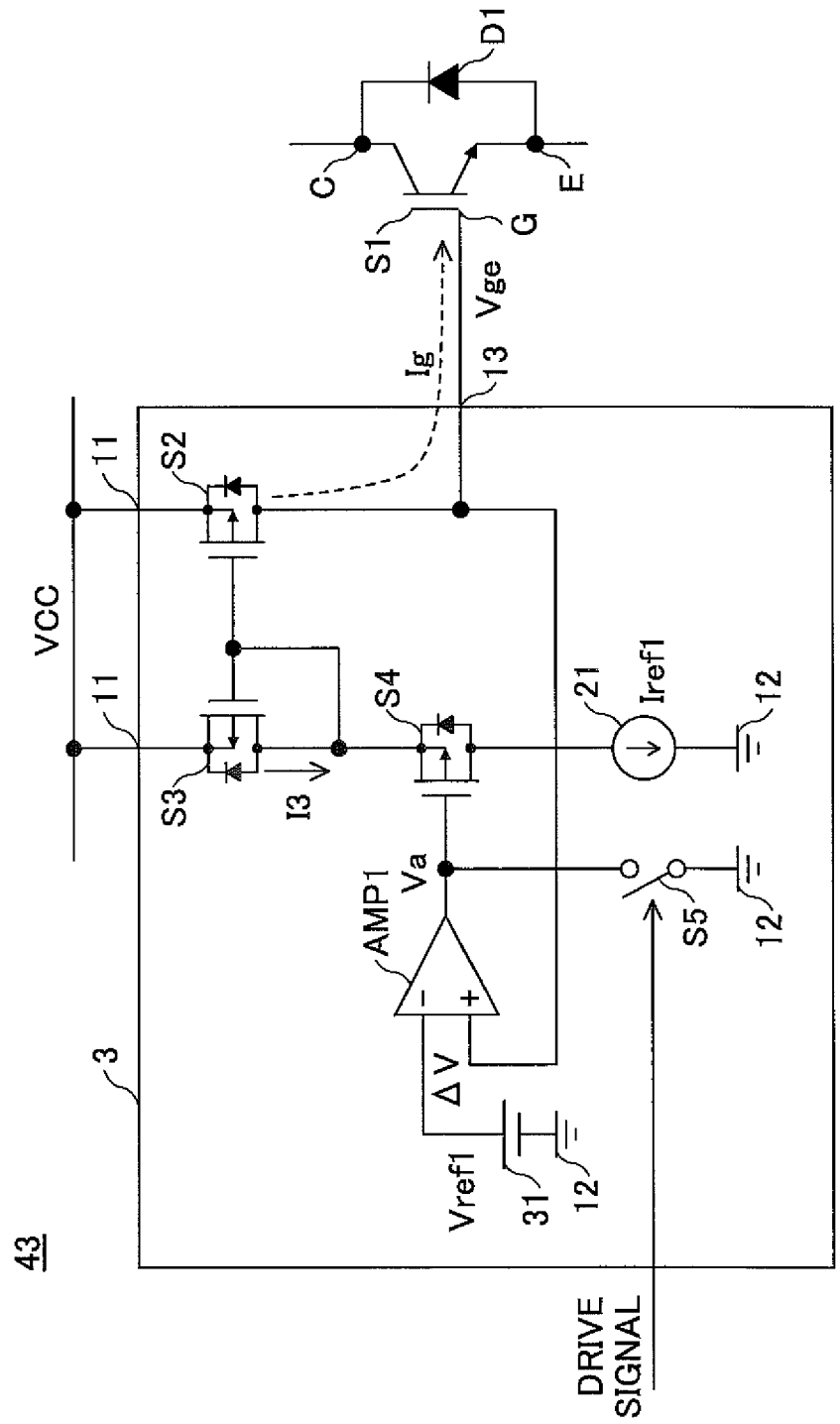
FIG. 6 is a configuration diagram illustrating an example of a drive circuit and a semiconductor apparatus.

FIG. 6 is a configuration diagram illustrating an example of a drive circuit 3 and a semiconductor apparatus 43. Description is omitted for substantially the same configuration and effects as in the embodiments described above. The control transistor S4 that is capable of turning down the constant current Iref1 may be a P-channel MOSFET or a PNP-type bipolar transistor. In this case, the operational amplifier AMP1 includes a non-inverted input terminal (+) connected with the gate drive node 13, and an inverted input terminal (−) connected with the constant voltage source 31.

Soon after the transistor S1 has been switched from off to on, the gate voltage Vge is a comparatively low voltage, and a voltage input into the non-inverted input terminal (+) of the operational amplifier AMP1 (voltage equivalent to the gate voltage Vge in FIG. 6) depending on the gate voltage Vge is sufficiently lower than the constant voltage Vref1. Therefore, since the potential difference ΔV between the gate voltage Vge and the constant voltage Vref1 is large, the control voltage Va output from the operational amplifier AMP1 is low. The low control voltage Va makes the voltage Vgs between the gate and source of the control transistor S4 higher than the threshold voltage Vth of the control transistor S4, with which the control transistor S4 transitions to an on state.

When the gate G of the transistor S1 starts being charged by the constant gate current Ig, the gate voltage Vge rises. Since the gate voltage Vge is applied as a feedback input to the non-inverted input terminal (+) of the operational amplifier AMP1, while the gate voltage Vge is rising, the voltage applied as input to the non-inverted input terminal (+) approaches the constant voltage Vref1.

When the voltage applied as input to the non-inverted input terminal (+) has risen to be virtually the same as the constant voltage Vref1 (has risen so that the potential difference ΔV becomes virtually zero), the control voltage Va starts rising from the voltage in the constant current operation. Since the rise of the control voltage Va also reduces the voltage Vgs between the gate and source of the control transistor S4, the current Ids flowing in the control transistor S4 in the on state reduces lower than the constant current Iref1 (see FIG. 7). When the current Ids reduces, the current I3 and the gate current Ig also reduce. Namely, the output transistor S2 supplies the gate current Ig to the gate G of the transistor S1, with which the voltage input into the non-inverted input terminal (+) of the operational amplifier AMP1 does not exceed the constant voltage Vref1 (the gate voltage Vge in FIG. 6).

When the gate voltage Vge is going to be reduced due to the reduction of the gate current Ig, the operational amplifier AMP1 adjusts the control voltage Va so that the constant voltage Vref1 is equivalent to the voltage input into the non-inverted input terminal (+). Namely, after the time t2 in FIG. 2 when the gate current Ig starts reducing, the operational amplifier AMP1 operates so that the gate voltage Vge is equivalent to the constant voltage Vref1.

Figure 7:
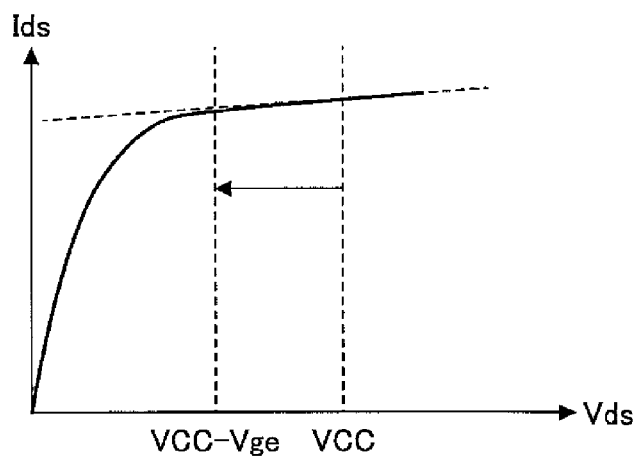
FIG. 7 is a diagram illustrating an example of a current characteristic of an output transistor.
Figure 8:
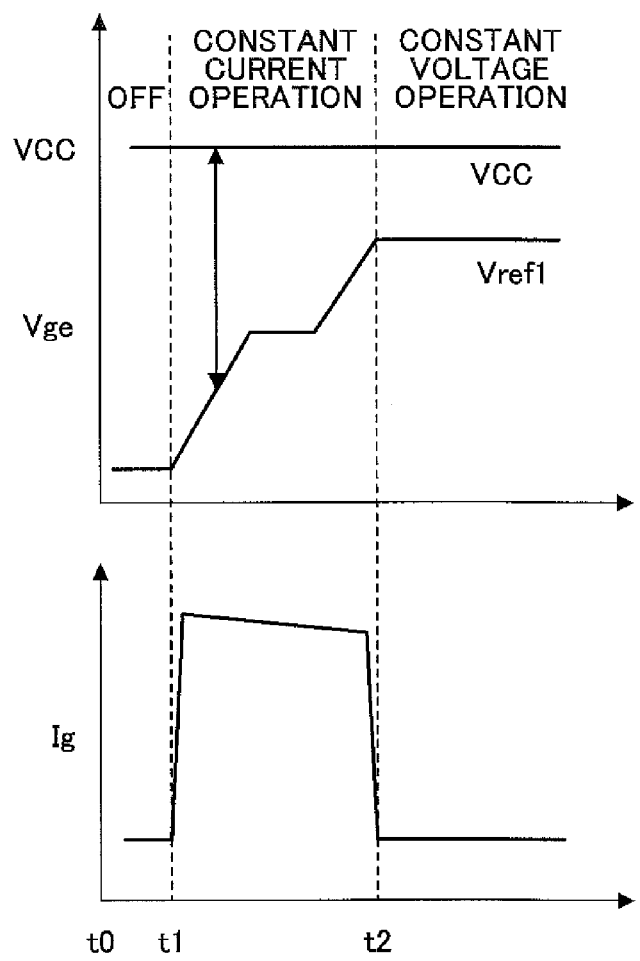
FIG. 8 is a timing chart illustrating an example of an operation of a drive circuit and a semiconductor apparatus.

FIG. 7 is a diagram illustrating an example of a current characteristic of the output transistor S2. Soon after the transistor S1 has been turned on, the voltage Vds between the drain and source of the output transistor S2 is virtually equivalent to the power supply voltage VCC. While the gate G of the transistor S1 is being charged by the gate current Ig, the gate voltage Vge rises, and hence, the voltage Vds between the drain and source of the output transistor S2 reduces (Vds=VCC−Vge). Namely, when the gate voltage Vge of the transistor S1 rises more by the gate current Ig, the voltage Vds between the drain and source of the output transistor S2 reduces more, and hence, the current Ids output from the output transistor S2 reduces slightly (FIG. 7). The slight reduction of the current Ids output from the output transistor S2 reduces the gate current Ig slightly (see a turn-on period t1-t2 in FIG. 8).

Figure 9:
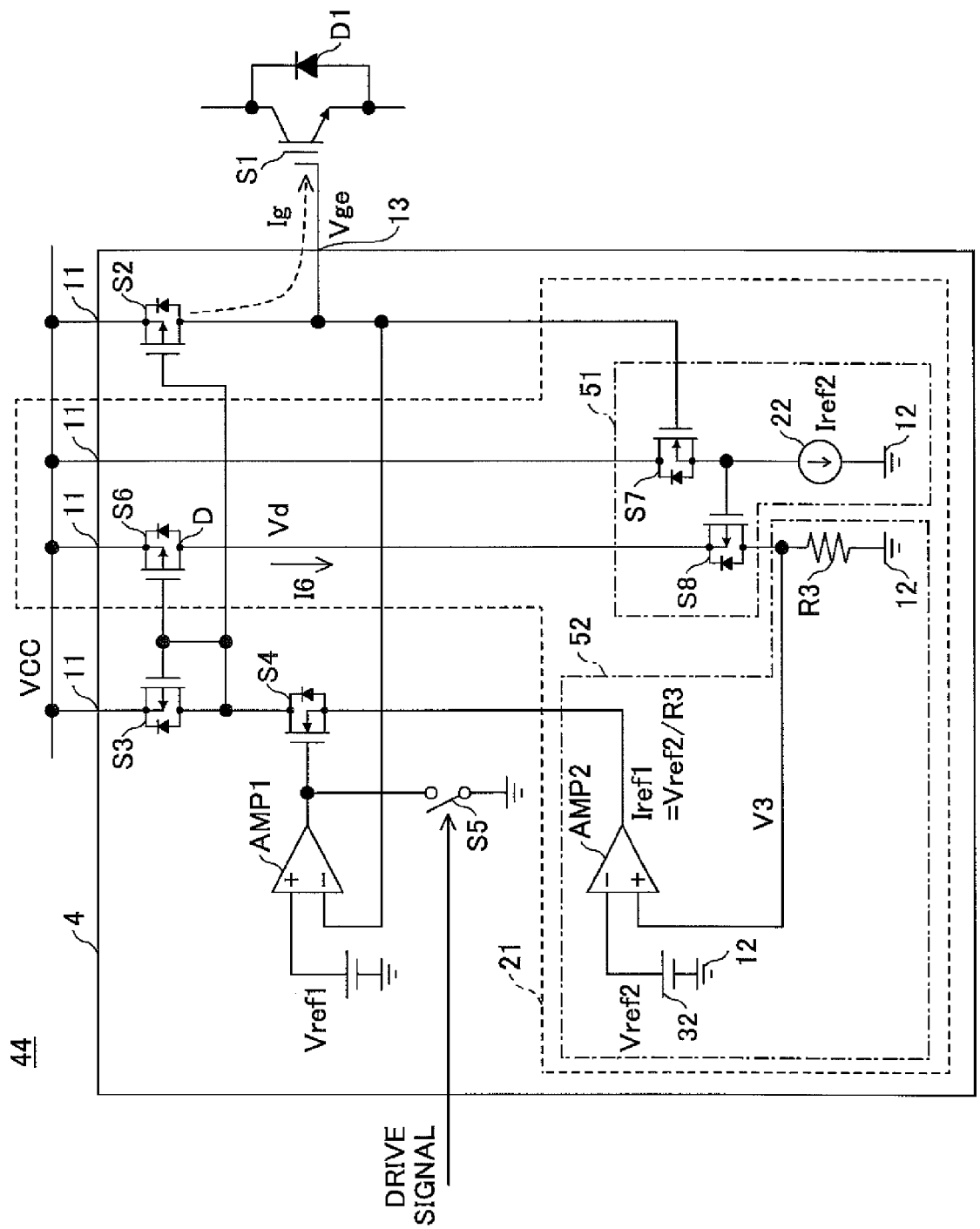
FIG. 9 is a configuration diagram illustrating an example of a drive circuit and a semiconductor apparatus.

Thereupon, to improve precision of the constant gate current Ig during a constant current operation (namely, to prevent the constant gate current Ig from reducing slightly), the drive circuit 4 in FIG. 9 includes a feedback circuit to make the gate current Ig output from the output transistor S2 constant.

FIG. 9 is a configuration diagram illustrating an example of a drive circuit 4 and a semiconductor apparatus 44. Description is omitted for substantially the same configuration and effects as in the embodiments described above. The constant current source 21 includes an adjustment transistor S6, a voltage generation circuit 51, and a current generation circuit 52.

The adjustment transistor S6 is a switching element that forms a current mirror with the input transistor S3. The adjustment transistor S6 is, for example, a P-channel MOSFET having the same structure as the output transistor S2, and has a characteristic (output characteristic with respect to the gate input) similar to that of the output transistor S2. Also, the size of the adjustment transistor S6 is, for example, the same as the size of the input transistor S3.

The voltage generation circuit 51 is an example of a unit that generates the same voltage as the gate drive node 13 at the drain D (output electrode) of the adjustment transistor S6. The voltage generation circuit 51 is, for example, a level shift circuit that includes a first transistor S7, a constant current circuit 22, and a second transistor S8.

The first transistor S7 is, for example, an N-channel MOSFET, and includes a gate connected with the gate drive node 13, a drain connected with the power source node 11, and a source connected with an upstream node of the constant current circuit 22. The constant current circuit 22 is a constant current source that flows a constant current Iref2 between the drain and source of the first transistor S7. The second transistor S8 is, for example, a P-channel MOSFET, and includes a gate connected with a connection point between the source of the first transistor S7 and the constant current circuit 22, a source connected with the drain D of the adjustment transistor S6, and a drain connected with an input point of the current generation circuit 52. The input point of the current generation circuit 52 is a connection point between a resistor R3 and the non-inverted input terminal (+) of the operational amplifier AMP2 in the figure.

The current generation circuit 52 is an example of a unit that generates a constant current Iref1 to make the output current (drain current I6) flowing in the drain D of the adjustment transistor S6 take a predetermined constant current value. The current generation circuit 52 includes, for example, the operational amplifier AMP2, the resistor R3, and a constant voltage source 32.

The operational amplifier AMP2 is a differential amplifier that generates the constant current Iref1 depending on a potential difference between a voltage V3 input depending on a drain current I6, and a constant reference voltage Vref2 lower than the power supply voltage VCC of the power source node 11. The voltage V3 is a voltage generated between both terminals of the resistor R3 when the drain current I6 flows into the resistor R3 via the second transistor S8. The resistor R3 is connected, for example, between the drain of the second transistor S8 and the ground node 12. The reference voltage Vref2 is generated by the constant voltage source 32.

The operational amplifier AMP2 includes a non-inverted input terminal (+) connected with a connection point between the resistor R3 and the non-inverted input terminal (+) of the operational amplifier AMP2, and an inverted input terminal (−) connected with the constant voltage source 32. Therefore, the operational amplifier AMP2 can output the constant current Iref1 (=Vref2/R3).

The gate of the first transistor S7 is connected with the gate drive node 13. Therefore, the source voltage of the first transistor S7 takes a voltage value obtained by subtracting the voltage Vgs between the gate and source of the first transistor S7 from the gate voltage Vge of the transistor S1. On the other hand, the source voltage of the second transistor S8 takes a voltage value obtained by adding the source voltage of the first transistor S7 and the voltage Vgs between the gate and source of the second transistor S8. Since the respective gate-source voltages Vgs of the first transistor S7 and the second transistor S8 (namely, the threshold voltages) are equivalent to each other, the drain voltage Vd of the drain D of the adjustment transistor S6 becomes equivalent to the gate voltage Vge of the transistor S1. In other words, the voltage Vds between the drain and source of the output transistor S2 can be made equivalent to the voltage Vds between the drain and source of the adjustment transistor S6.

Thus, for the current Ids flowing between the drain and source of the output transistor S2 that depends on Vds, the dependency on Vds is copied to the adjustment transistor S6. Namely, a characteristic of the gate current Ig output from the output transistor S2 that depends on the voltage Vds, and a characteristic of the drain current I6 output from the adjustment transistor S6 that depends on the voltage Vds, can be made similar.

Therefore, when the gate current Ig reduces slightly, the slight reduction of the drain current I6 makes the voltage V3 reduce slightly. However, to make the voltage V3 equivalent to the constant reference voltage Vref2, the operational amplifier AMP2 pulls in an increased amount of the current I3 flowing in the input transistor S3 via the control transistor S4, which compensates for the slight reduction of the gate current Ig output from the output transistor S2. Namely, the gate current Ig is precisely maintained to be constant.

Figure 10:
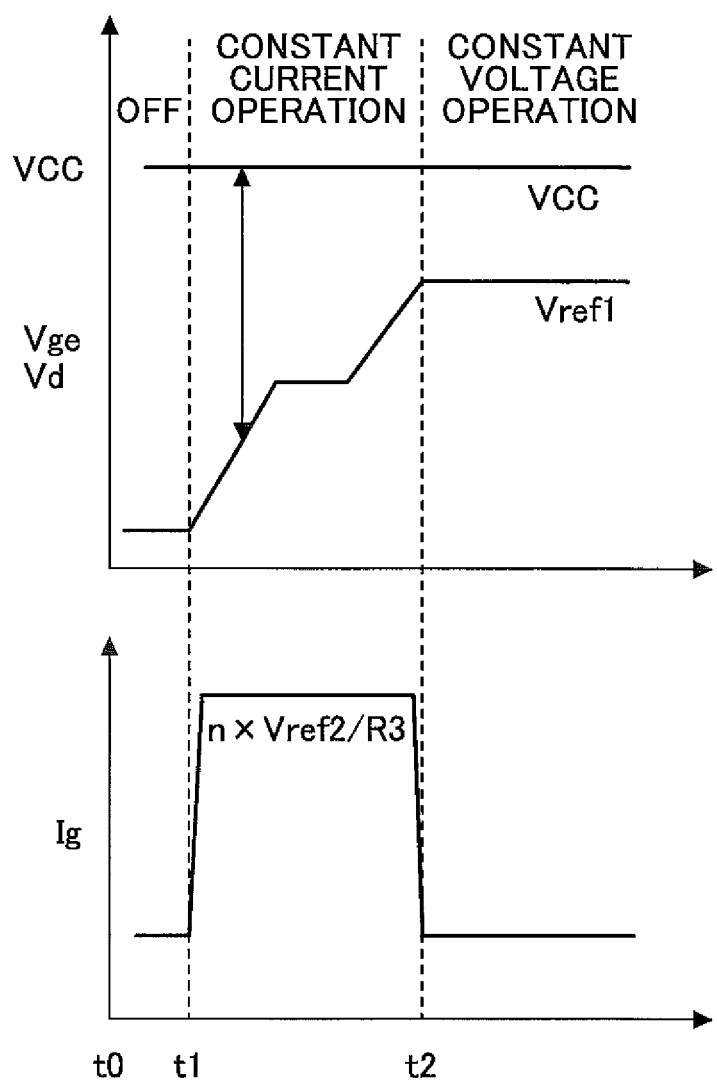
FIG. 10 is a timing chart illustrating an example of an operation of a drive circuit and a semiconductor apparatus.

FIG. 10 is a timing chart illustrating an example of an operation of the drive circuit 4 and the semiconductor apparatus 44. Since the drain voltage Vd of the adjustment transistor S6 is equivalent to the gate voltage Vge of the transistor S1, during a period when the gate G of the transistor S1 is charged by the gate current Ig, the drain voltage Vd of the adjustment transistor S6 also rises. Therefore, characteristics can be made similar for the output currents of the output transistor S2 and the adjustment transistor S6 where both depend on the voltage Vds. Since the operational amplifier AMP2 performs constant current control to make the output current of the adjustment transistor S6 constant, the output transistor S2 can output the constant gate current Ig without depending on the voltage Vds between the drain and source of the output transistor S2.

Figure 11:
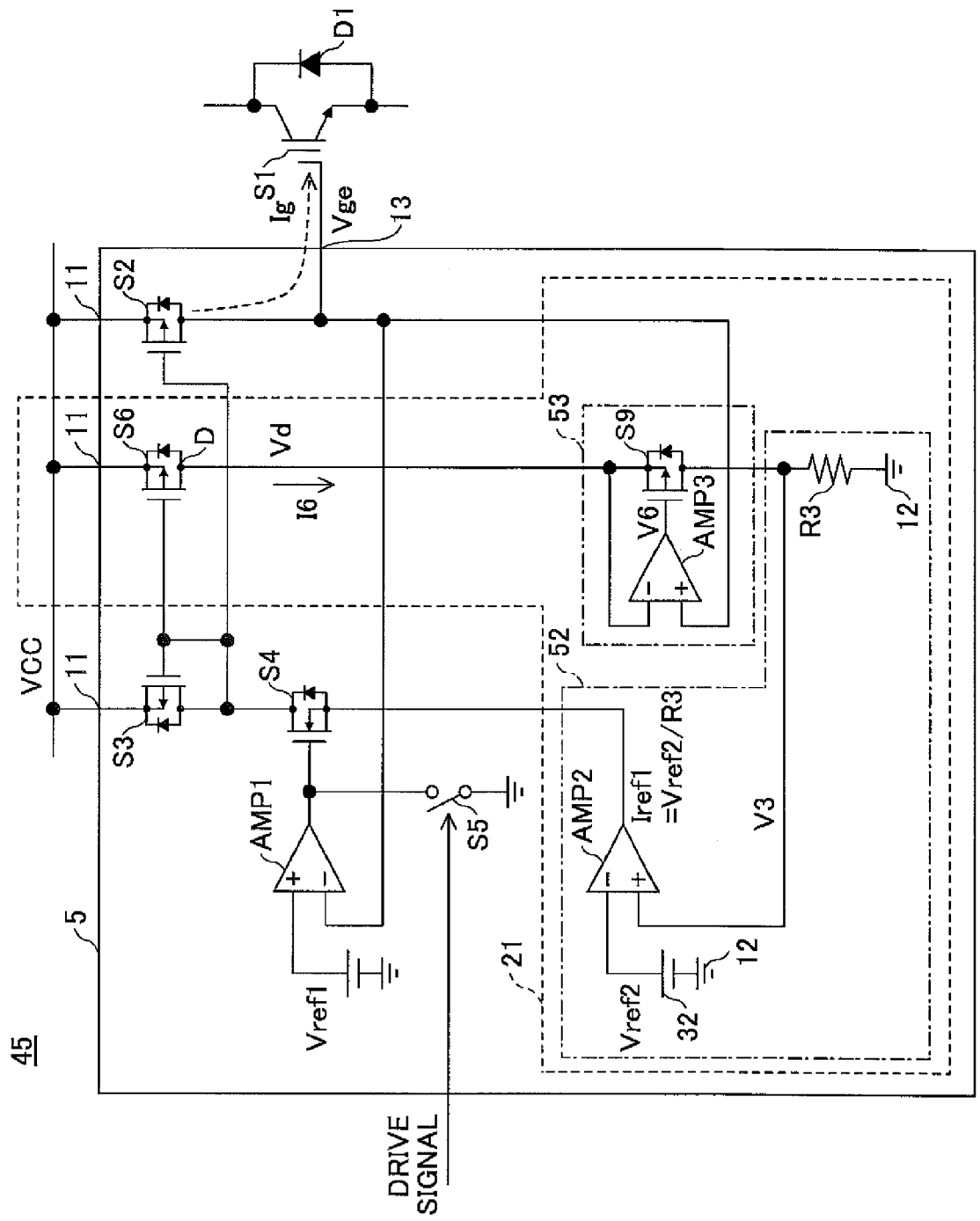
FIG. 11 is a configuration diagram illustrating an example of a drive circuit and a semiconductor apparatus.

FIG. 11 is a configuration diagram illustrating an example of a drive circuit 5 and a semiconductor apparatus 45. Description is omitted for substantially the same configuration and effects as in the embodiments described above. The constant current source 21 includes the adjustment transistor S6, a voltage generation circuit 53, and the current generation circuit 52. FIG. 11 differs from FIG. 9 in the configuration of the voltage generation circuit.

The voltage generation circuit 53 is an example of a unit that generates the same voltage as that of the gate drive node 13 at the drain D (output electrode) of the adjustment transistor S6, which is, for example, a voltage feedback circuit that includes an operational amplifier AMP3 and a transistor S9.

The operational amplifier AMP3 is a differential amplifier to output an output voltage V6 depending on a potential difference between the gate voltage Vge of the transistor S1 and the drain voltage Vd of the adjustment transistor S6. The operational amplifier AMP3 includes a non-inverted input terminal (+) connected with the gate drive node 13, an inverted input terminal (−) connected with the drain D of the adjustment transistor S6, and an output terminal connected with the control electrode of the transistor S9.

The transistor S9 is, for example, a P-channel MOSFET, and includes a gate receiving the output voltage V6 as input (control electrode), a source connected with the drain D of the adjustment transistor S6, and a drain connected with an input point of the current generation circuit 32.

A constant current operation and a constant voltage operation of the drive circuit 5 or the semiconductor apparatus 45 in FIG. 11 are the same as those in FIG. 9. Therefore, the gate current Ig output during a constant current operation can be prevented from reducing slightly.

Figure 12:
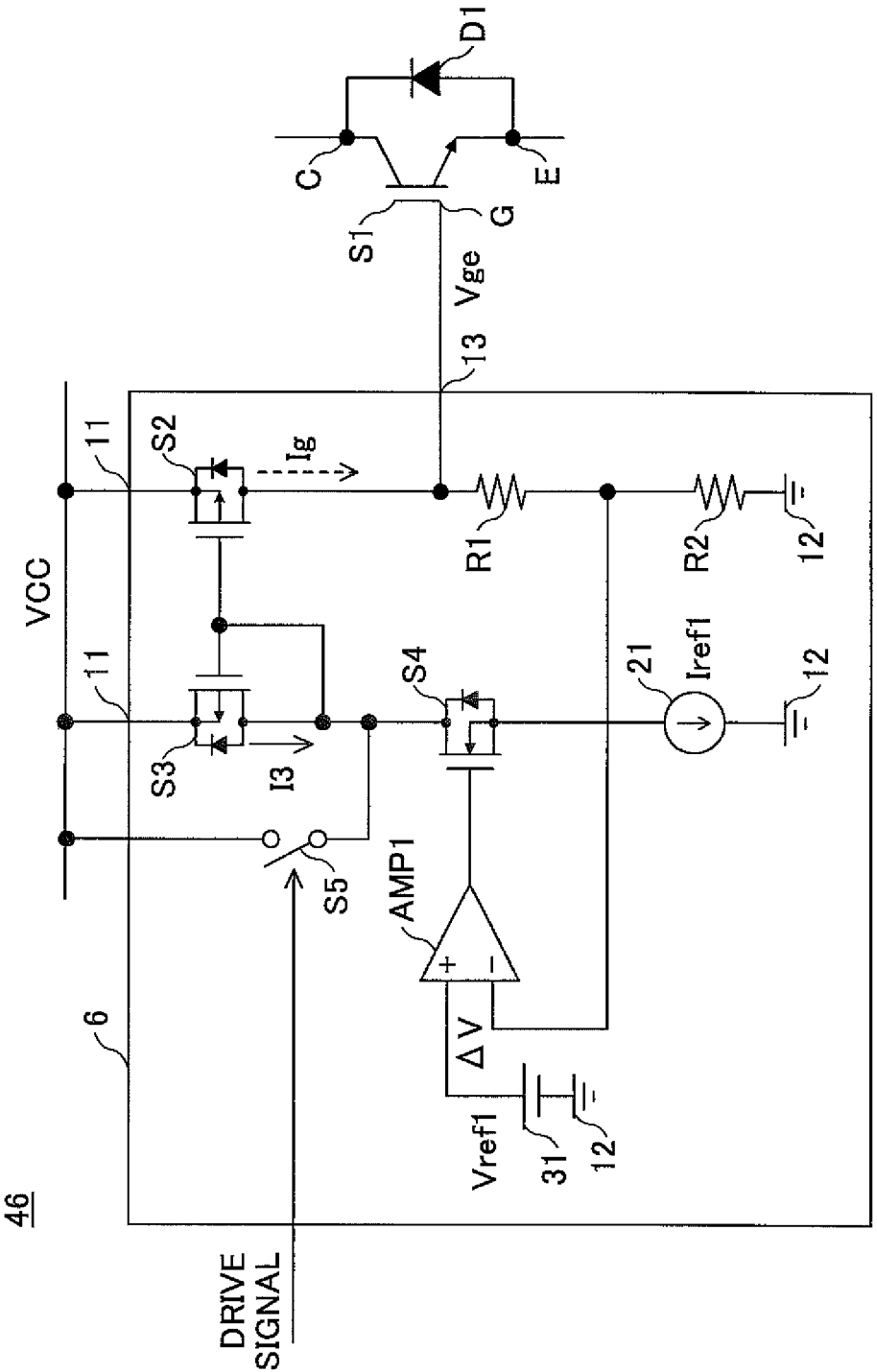
FIG. 12 is a configuration diagram illustrating an example of a drive circuit and a semiconductor apparatus.

FIG. 12 is a configuration diagram illustrating an example of a drive circuit 6 and a semiconductor apparatus 46. Description is omitted for substantially the same configuration and effects as in the embodiments described above.

The drive circuit 6 includes a switch S5 that turns off the output transistor S2. The switch S5 is a switching element that turns off the input transistor S3 and the output transistor S2, by making the voltages of the gates (control electrodes) of the input transistor S3 and the output transistor S2 less than or equal to the threshold voltages Vth of the input transistor S3 and the output transistor S2, respectively. By turning off the input transistor S3 and the output transistor S2, the gate current Ig and the power supply voltage VCC are not output to the gate G of the transistor S1, and hence, the transistor S1 can be turned off (see an off period t0-t1 in FIG. 2, and FIG. 3).

The switch S5 is placed, for example, between the control electrodes of the input transistor S3 and the output transistor S2, and the power source node 11, and turns off the input transistor S3 and the output transistor S2 by connecting the control electrodes of the input transistor S3 and the output transistor S2 with the power source node 11.

Although the drive circuit and the semiconductor apparatus are described with the embodiments as above, the present invention is not limited to the above embodiments. Various modifications and improvements can be made within the scope of the present invention by combining and/or replacing a part of or all of the embodiments with the others.

For example, the semiconductor apparatus may be a semiconductor apparatus that has a configuration formed by an integrated circuit, or a semiconductor apparatus that has a configuration formed by discrete components.

Also, the transistor S1 may be a switching element other than an IGBT, for example, an N-channel or P-channel MOSFET, or an NPN-type or PNP-type bipolar transistor. In a case of a MOSFET, the wording may be changed to read a "collector" as a "drain", and an "emitter" as a "source", and in a case of a bipolar transistor, a "gate" as a "base".

Also, the output transistor S2 or the input transistor S3 may be a switching element other than a P-channel MOSFET, for example, a PNP-type bipolar transistor. The control transistor S4 may be a switching element other than an N-channel MOSFET, for example, an NPN-type bipolar transistor.

Also, for example, a configuration in which a voltage obtained by dividing the voltage of the gate drive node 13 by resistors is input into the operational amplifier AMP1, may not be limited to the drive circuit in FIG. 4, but may be included in other drive circuits such as those in FIGS. 6, 9, and 11.

The present application is based on Japanese Priority Application No. 2014-117325, filed on Jun. 6, 2014, the entire contents of which are hereby incorporated by reference.

The invention claimed is:

1. A drive circuit, comprising:
a gate drive node;
a power source node;
an output transistor configured to be connected between the gate drive node and the power source node, and to flow a current into the gate drive node;
an input transistor configured to form a current mirror with the output transistor, and to have a smaller size than the output transistor;
an operational amplifier configured to output a control voltage depending on a potential difference between a voltage received as input depending on a voltage of the gate drive node, and a constant voltage lower than a voltage of the power source node;
a control transistor configured to include a control electrode receiving as input an output of the operational amplifier, and to be connected in series with the input transistor; and
a constant current source configured to be connected in series with the control transistor, the constant current source including:
an adjustment transistor configured to form a current mirror with the input transistor; and
a voltage generation circuit configured to generate a voltage equivalent to the voltage of the gate drive node, at an output electrode of the adjustment transistor.

2. The drive circuit, as claimed in claim 1, wherein the voltage generation circuit includes
a first transistor configured to have a gate connected with the gate drive node,
a constant current circuit configured to flow a constant current between a drain and a source of the first transistor, and
a second transistor configured to have a gate connected with the source of the first transistor, and a source connected with the output electrode.

3. The drive circuit, as claimed in claim 1, wherein the voltage generation circuit includes
an operational amplifier configured to output an output voltage depending on a potential difference between the voltage of the gate drive node and a voltage of the output electrode, and
a transistor configured to have a gate receiving as input the output voltage and a source connected with the output electrode.

4. A semiconductor apparatus, comprising:
the drive circuit as claimed in claim 1; and
a switching element configured to include a gate connected with the gate drive node.

5. A drive circuit, comprising:
a gate drive node;
a power source node;
an output transistor configured to be connected between the gate drive node and the power source node, and to flow a current into the gate drive node;
an input transistor configured to form a current mirror with the output transistor, and to have a smaller size than the output transistor;
an operational amplifier configured to output a control voltage depending on a potential difference between a voltage received as input depending on a voltage of the gate drive node, and a constant voltage lower than a voltage of the power source node;
a control transistor configured to include a control electrode receiving as input an output of the operational amplifier, and to be connected in series with the input transistor; and
a constant current source configured to be connected in series with the control transistor, the constant current source including:
an adjustment transistor configured to form a current mirror with the input transistor, the adjustment transistor having an output electrode; and
a current generation circuit configured to generate constant current to make an output current flowing in the output electrode constant.

6. The drive circuit, as claimed in claim 5, wherein the current generation circuit includes an operational amplifier configured to generate the constant current depending on a potential difference between a voltage received as input depending on the output current, and a constant reference voltage lower than the voltage of the power source node.

7. A semiconductor apparatus, comprising:
the drive circuit as claimed in claim 5; and
a switching element configured to include a gate connected with the gate drive node.

8. A drive circuit, comprising:
a gate drive node;
a power source node;
an output transistor configured to be connected between the gate drive node and the power source node, and to flow a current into the gate drive node;
an input transistor configured to form a current mirror with the output transistor, and to have a smaller size than the output transistor;
an operational amplifier configured to output a control voltage depending on a potential difference between a voltage received as input depending on a voltage of the gate drive node, and a constant voltage lower than a voltage of the power source node;
a control transistor configured to include a control electrode receiving as input an output of the operational amplifier, and to be connected in series with the input transistor; and
a constant current source configured to be connected in series with the control transistor,
wherein a voltage obtained by dividing the voltage of the gate drive node by resistors is input into the operational amplifier.

9. A semiconductor apparatus, comprising:
the drive circuit as claimed in claim 8; and
a switching element configured to include a gate connected with the gate drive node.

10. A drive circuit, comprising:
a gate drive node;
a power source node;

an output transistor configured to be connected between the gate drive node and the power source node, and to flow a current into the gate drive node;

an input transistor configured to form a current mirror with the output transistor, and to have a smaller size than the output transistor;

an operational amplifier configured to output a control voltage depending on a potential difference between a voltage received as input depending on a voltage of the gate drive node, and a constant voltage lower than a voltage of the power source node;

a control transistor configured to include a control electrode receiving as input an output of the operational amplifier, and to be connected in series with the input transistor;

a constant current source configured to be connected in series with the control transistor; and a switch configured to turn off the output transistor.

11. The drive circuit, as claimed in claim 10, wherein the switch turns off the output transistor by turning off the control transistor.

12. A semiconductor apparatus, comprising:

the drive circuit as claimed in claim 10; and a switching element configured to include a gate connected with the gate drive node.

* * * * *